United States Patent
Chen

(10) Patent No.: US 8,031,550 B2
(45) Date of Patent: Oct. 4, 2011

(54) VOLTAGE REGULATOR CIRCUIT FOR A MEMORY CIRCUIT

(75) Inventor: Chung Zen Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 162 days.

(21) Appl. No.: 12/132,098

(22) Filed: Jun. 3, 2008

(65) Prior Publication Data

US 2009/0296509 A1    Dec. 3, 2009

(51) Int. Cl.
*G11C 5/14* (2006.01)
(52) U.S. Cl. .................... 365/227; 365/226; 365/189.09
(58) Field of Classification Search ................... 365/226, 365/227, 189.09
See application file for complete search history.

(56) References Cited

U.S. PATENT DOCUMENTS

| | | | |
|---|---|---|---|
| 5,337,284 A * | 8/1994 | Cordoba et al. | 365/227 |
| 6,385,119 B2 | 5/2002 | Kobayashi et al. | |
| 6,456,553 B1 | 9/2002 | Brass et al. | |
| 7,248,532 B2 | 7/2007 | Schoenfeld | |
| 2007/0001752 A1 | 1/2007 | Jin | |

* cited by examiner

*Primary Examiner* — Jason Lappas
(74) *Attorney, Agent, or Firm* — Connolly Bove Lodge & Hutz LLP

(57) ABSTRACT

A voltage regulator circuit for a memory circuit comprises a voltage divider, a capacitor, an active-mode voltage regulator and a standby-mode voltage regulator. The active-mode voltage regulator is always on while in active mode, and turned on whenever a refresh is requested. The standby-mode voltage regulator is periodically turned on while in standby mode, and turned on whenever a refresh is requested. In addition, the active voltage regulator uses stronger transistors than those used by the standby-mode voltage regulator, and both the active-mode voltage regulator and the standby-mode voltage regulator are coupled to the voltage divider and the capacitor.

6 Claims, 6 Drawing Sheets

US 8,031,550 B2

VOLTAGE REGULATOR CIRCUIT FOR A MEMORY CIRCUIT

BACKGROUND OF THE INVENTION

1. Field of the Invention

The present invention relates to a voltage regulator circuit for a memory circuit, and more particularly, to a voltage regulator circuit having a capacitor for a memory circuit.

2. Description of the Related Art

Voltage regulators are used to regulate voltage levels of a circuit and supply internal power. In memory devices, such as DRAM, many voltage regulators are used, which unavoidably consume a lot of power. To solve such problem, U.S. Pat. No. 6,456,553 discloses a method that turns off the voltage regulators while in standby mode unless a self-refresh in standby mode is requested. Although such method can save power, it is not easy to maintain or immediately generate the voltage level needed for power-up upon a self-refresh request.

US20070001752 and U.S. Pat. No. 7,248,532 disclose another method that reduces the operating voltage in standby mode to 1.5 volts in contrast with 2 volts in active mode. However, because the charge stored in the DRAM cells in standby mode is smaller than the charge needed in active mode, the refresh cycle must be shortened to maintain system operability.

U.S. Pat. No. 6,385,119 discloses one large power voltage-drop regulator and one small power voltage-drop regulator. The large power voltage-drop regulator is turned on while in active mode only. In addition, the small power voltage-drop regulator is always on, including during active, active pause and standby modes. However, the small power voltage-drop regulator still consumes power while in standby mode, and does not perform well upon a self-refresh request.

SUMMARY OF THE INVENTION

The above-mentioned problems are addressed by the present invention. The method of the present invention will be understood according to the disclosure of the following specification and drawings.

According to one embodiment of the present invention, the voltage regulator circuit for a memory circuit comprises a voltage divider, a capacitor and a voltage regulator. The voltage regulator has one end connected to the voltage divider and the other end connected to the capacitor. The voltage regulator is always on while in active mode, periodically turned on while in standby mode and turned on whenever a refresh is requested. In addition, the voltage regulator adopts the same operating voltage whether in active mode or in standby mode.

According to another embodiment of the present invention, the voltage regulator circuit for a memory circuit comprises a voltage divider, a capacitor, an active-mode voltage regulator and a standby-mode voltage regulator. The active-mode voltage regulator is always on while in active mode, and turned on whenever a refresh is requested. The standby-mode voltage regulator is periodically turned on while in standby mode, and turned on whenever a refresh is requested. In addition, the active voltage regulator uses stronger transistors than those used by the standby-mode voltage regulator, and both the active-mode voltage regulator and the standby-mode voltage regulator are connected to the voltage divider and the capacitor.

According to another embodiment of the present invention, the voltage regulator circuit for a memory circuit comprises a voltage divider, a capacitor and a voltage-regulating means. The voltage-regulating means has one end connected to the voltage divider and the other end connected to the capacitor. The voltage-regulating means uses the same operating voltage whether in active mode or in standby mode.

BRIEF DESCRIPTION OF THE DRAWINGS

The invention will be described according to the appended drawings in which.

DETAILED DESCRIPTION OF THE INVENTION

Figure 1:
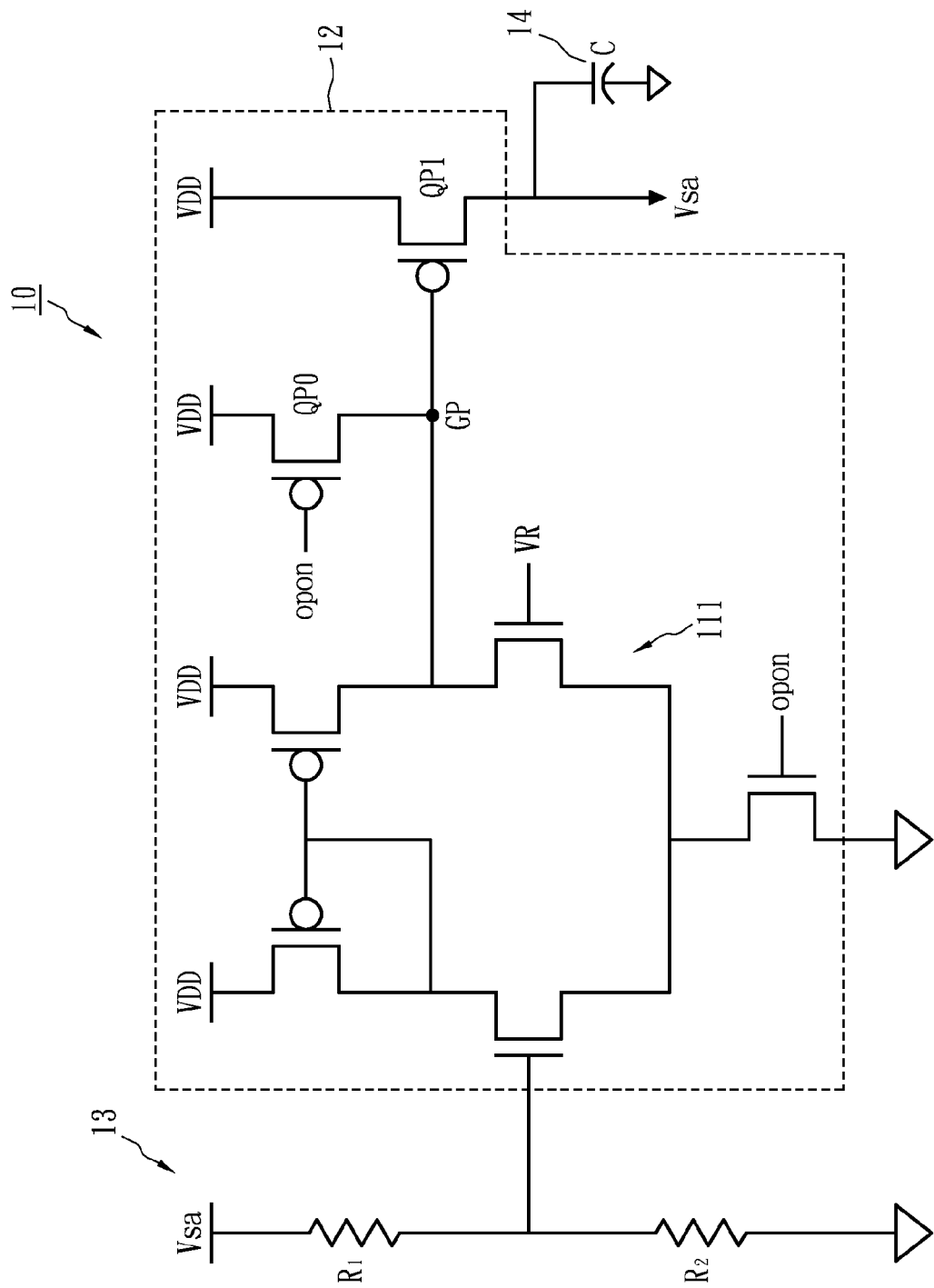
FIG. 1 shows a voltage regulator circuit for a memory circuit according to one embodiment of the present invention.

FIG. 1 shows a voltage regulator circuit for a memory circuit according to one embodiment of the present invention. Generally, the voltage regulator circuit 10 for a memory circuit comprises a voltage divider 13, a voltage regulator 12 and a capacitor 14. The voltage divider 13 could be made of series-connected transistors with pre-determined equivalent resistors R1, R2. The voltage regulator 12 is coupled to the voltage divider 13 and capacitor 14. The voltage regulator 12 is always on while in active mode to provide the necessary power supply, and periodically or intermittently turned on while in standby mode. The operational amplifier 111 is controlled by an "opon" parameter. The operational amplifier 111 functions only when the "opon" parameter is asserted. Thus, the transistor QP0 is turned off and the transistor QP1 is turned on. Generally, the current flowing through the operational amplifier 111 is negligible.

Figure 3:
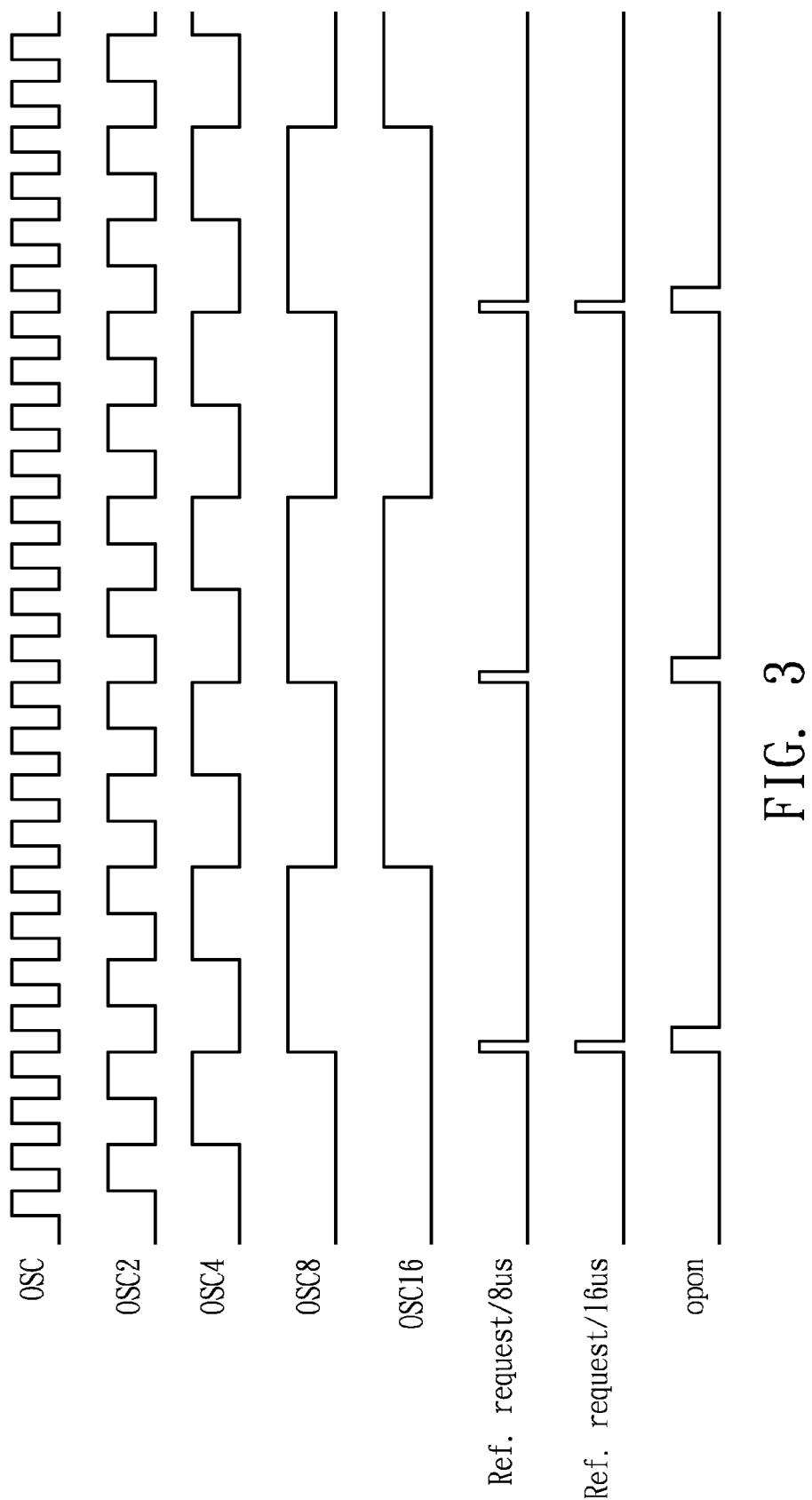
FIG. 3 shows a timing diagram of an "opon" signal.
Figure 4:
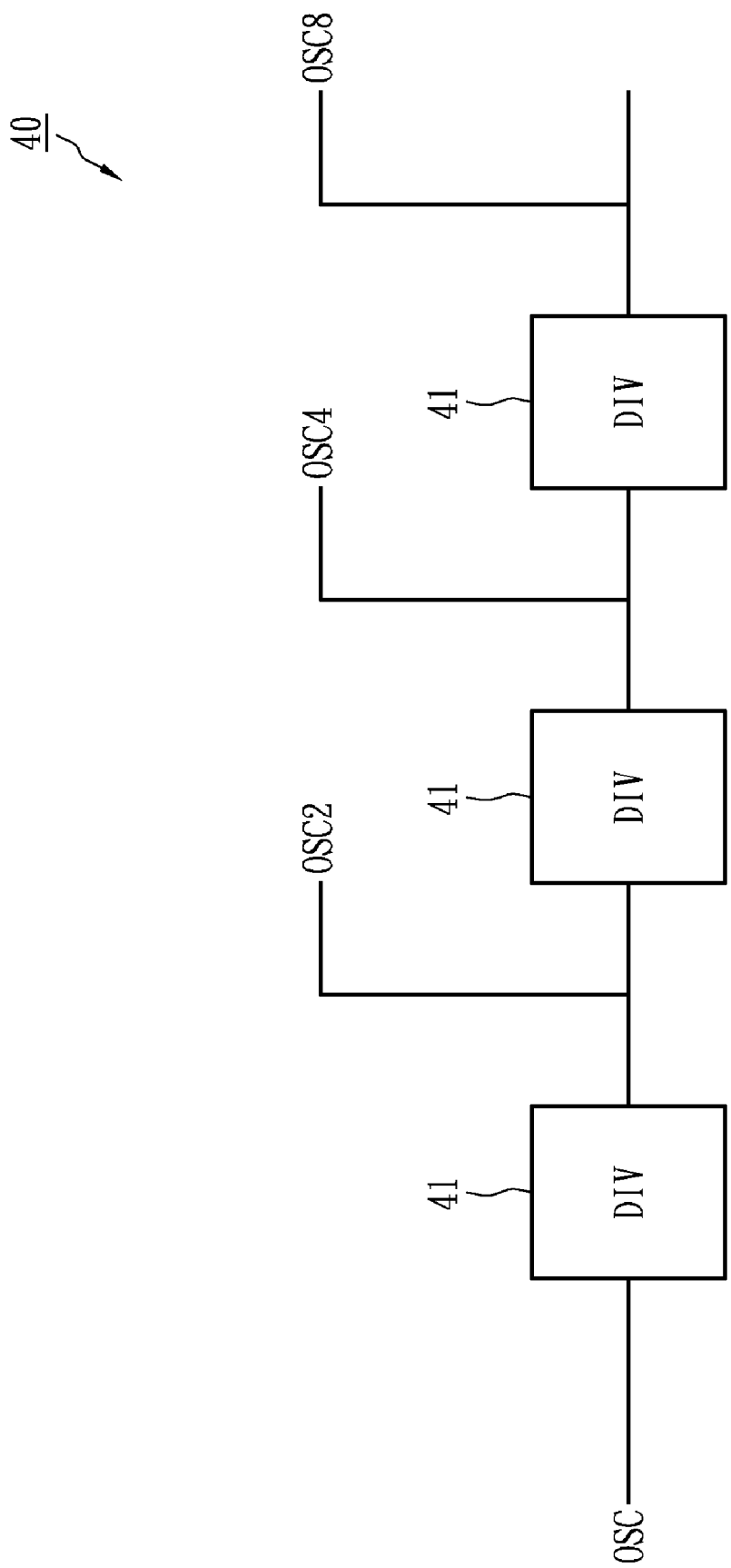
FIG. 4 shows a frequency-dividing circuit.

The turn-on condition "opon" for the voltage regulator 12 is represented as CS+($\overline{CS}$×$\overline{OSC}$×$\overline{OSC2}$×$\overline{OSC4}$×OSC8)+refresh request latch. When CS is asserted, the memory device is in active mode; otherwise the memory device is in standby mode. The oscillation signals OSC2, OSC4 and OSC8 represent divided frequency of the oscillation signal OSC. A frequency-dividing circuit 40 including a plurality of division-by-2 elements 41 is shown in FIG. 4. The equation ($\overline{CS}$×$\overline{OSC}$×$\overline{OSC2}$×$\overline{OSC4}$×OSC8) represents the timing in standby mode, where the oscillation signals OSC, OSC2 and OSC4 stay in a low level and the oscillation signal OSC8 stays in a high level, as shown in FIG. 3. Therefore, the opon signal is guaranteed to be asserted for at least a half-cycle duration of the OSC signal per eight OSC cycle times.

Figure 2:
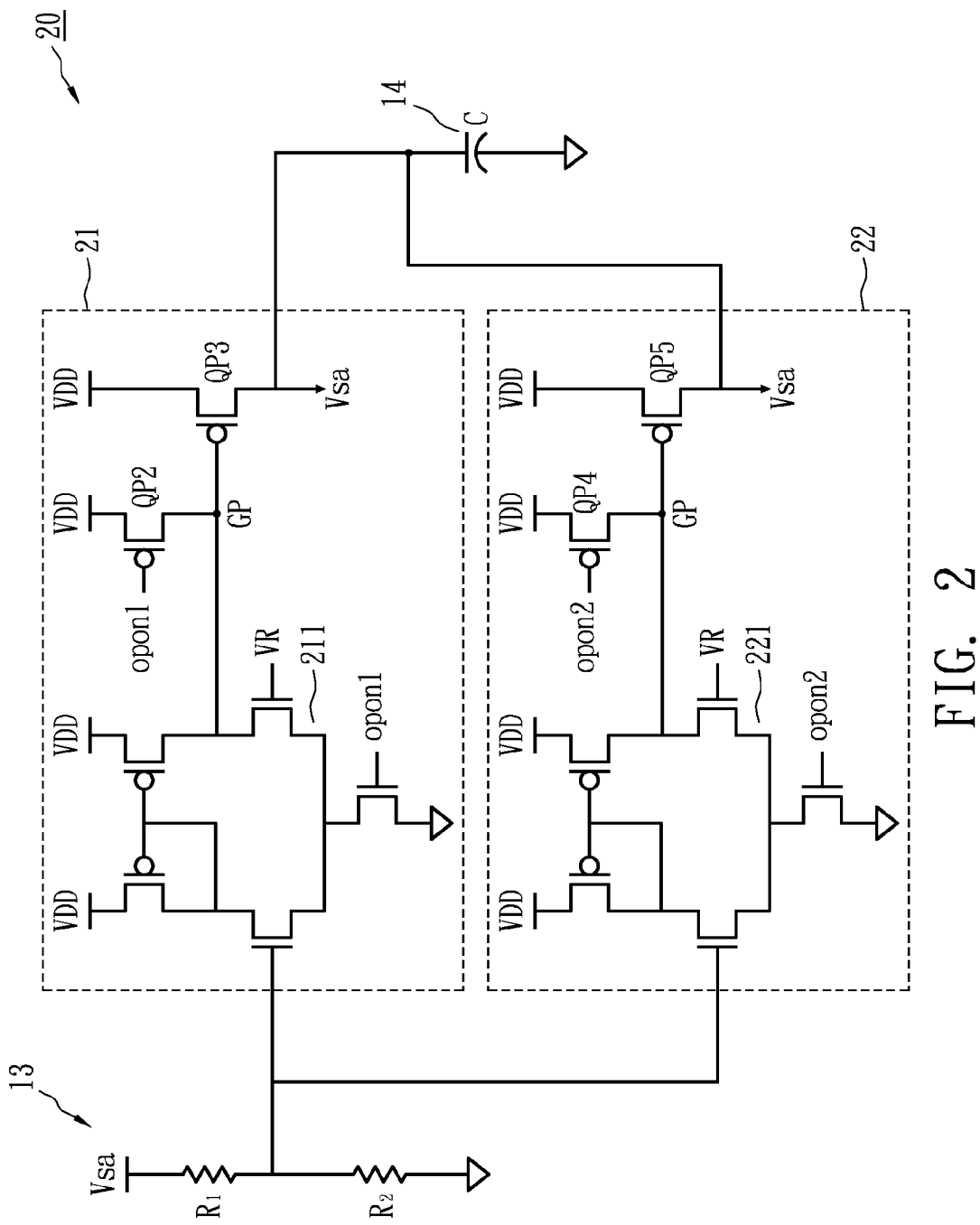
FIG. 2 shows a voltage regulator circuit for a memory circuit according to another embodiment of the present invention.

FIG. 2 shows a voltage regulator circuit for a memory circuit according to another embodiment of the present invention. Generally, the voltage regulator circuit 20 for a memory circuit comprises a voltage divider 13, an active-mode voltage regulator 21, a standby-mode voltage regulator 22 and a capacitor 14. The active-mode voltage regulator 21 and the standby-mode voltage regulator 22 share the same voltage divider 13 and capacitor 14. To reduce the necessary power consumption, the active-mode voltage regulator 21 is designed to have a bigger operational amplifier or stronger transistors in order to respond quickly. However, the standby-mode voltage regulator 22 is designed to have a smaller operational amplifier or weaker transistors in order to save power. The active-mode voltage regulator 21 is always on while in active mode to provide the necessary power supply. In addition, the active-mode voltage regulator 21 is further turned on while in standby mode whenever a refresh is requested. However, the standby-mode voltage regulator 22 is designed to be periodically or intermittently turned on or turned off while in standby mode. The operational amplifiers 211 and 221 are controlled by parameters "opon1" and "opon2," respectively. The operational amplifiers 211 and 221 function only when the parameters "opon1" or "opon2" are asserted. Thus, the transistors QP2 and QP4 are turned off and the transistor QP3 and QP5 are turned on. Generally, the current flowing through the operational amplifiers 211 and 221 are negligible compared to the current sinked by other circuits.

The turn-on condition "opon1" for the voltage regulator 21, for example, is represented as CS+refresh request latch. In addition, the turn-on condition "opon2" for the voltage regulator 22, for example, is represented as ($\overline{CS \times \overline{OSC} \times \overline{OSC2} \times \overline{OSC4} \times OSC8}$)+refresh request latch. Therefore, the signal opon2 is guaranteed to be asserted for at least a half-cycle duration of the OSC signal per eight OSC cycle times, and the signal opon1 is asserted in standby mode if a refresh is requested in order to reinforce the driving capability of the refresh operation.

Figure 5:
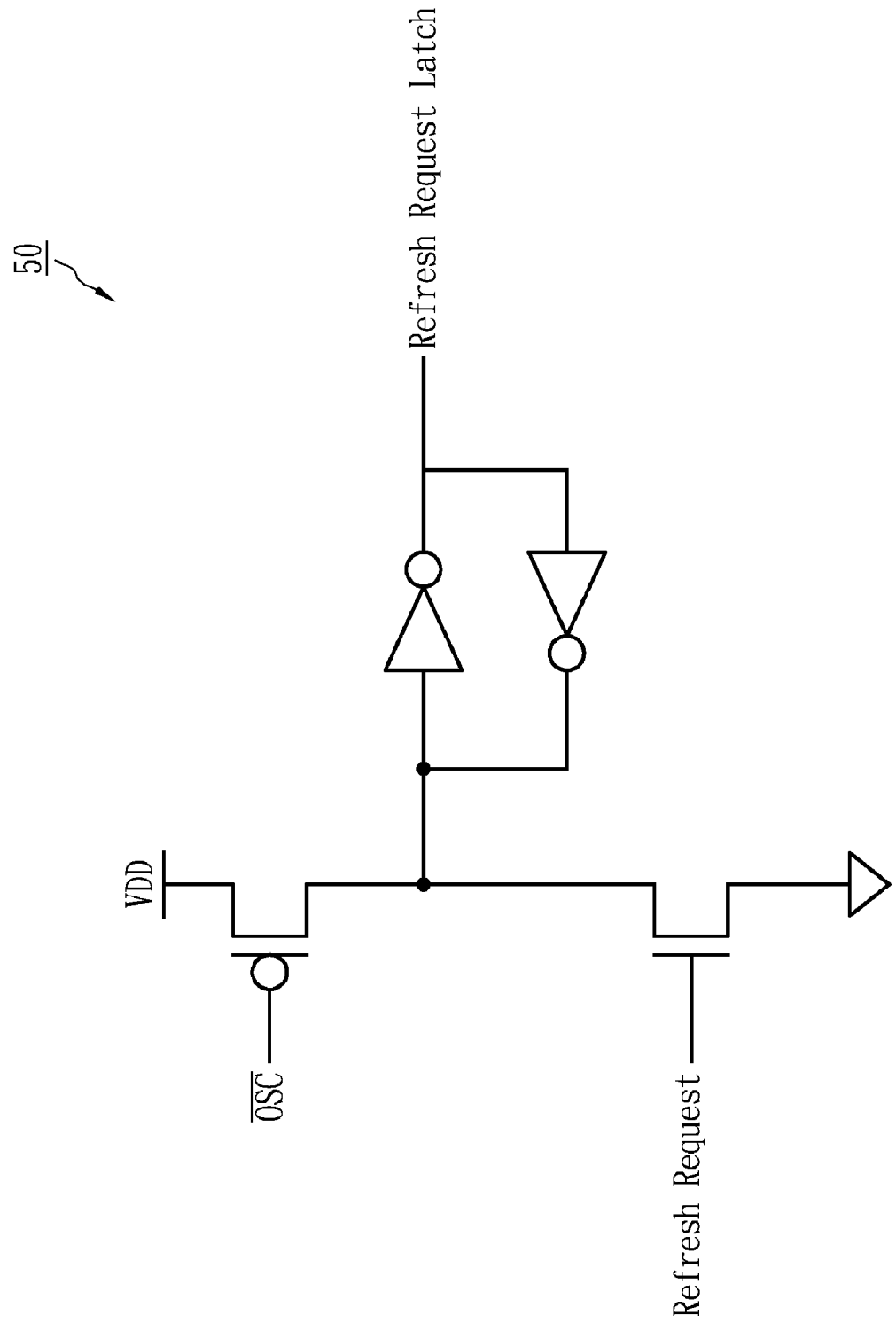
FIG. 5 shows a refresh request circuit.

The refresh request latch signal is generated by a refresh request circuit 50, as shown in FIG. 5. Assuming the refresh rate is 16 μs per word line in the memory chip, the refresh request is active at the falling edges of OSC, OSC2 and OSC4 and at OSC8 going high edge and OSC16 at the low state. Alternatively, assuming the refresh rate is 8 μs per word line in the memory chip, the refresh request is active at the falling edges of OSC, OSC2 and OSC4 and at OSC8 going high edge.

Figure 6:
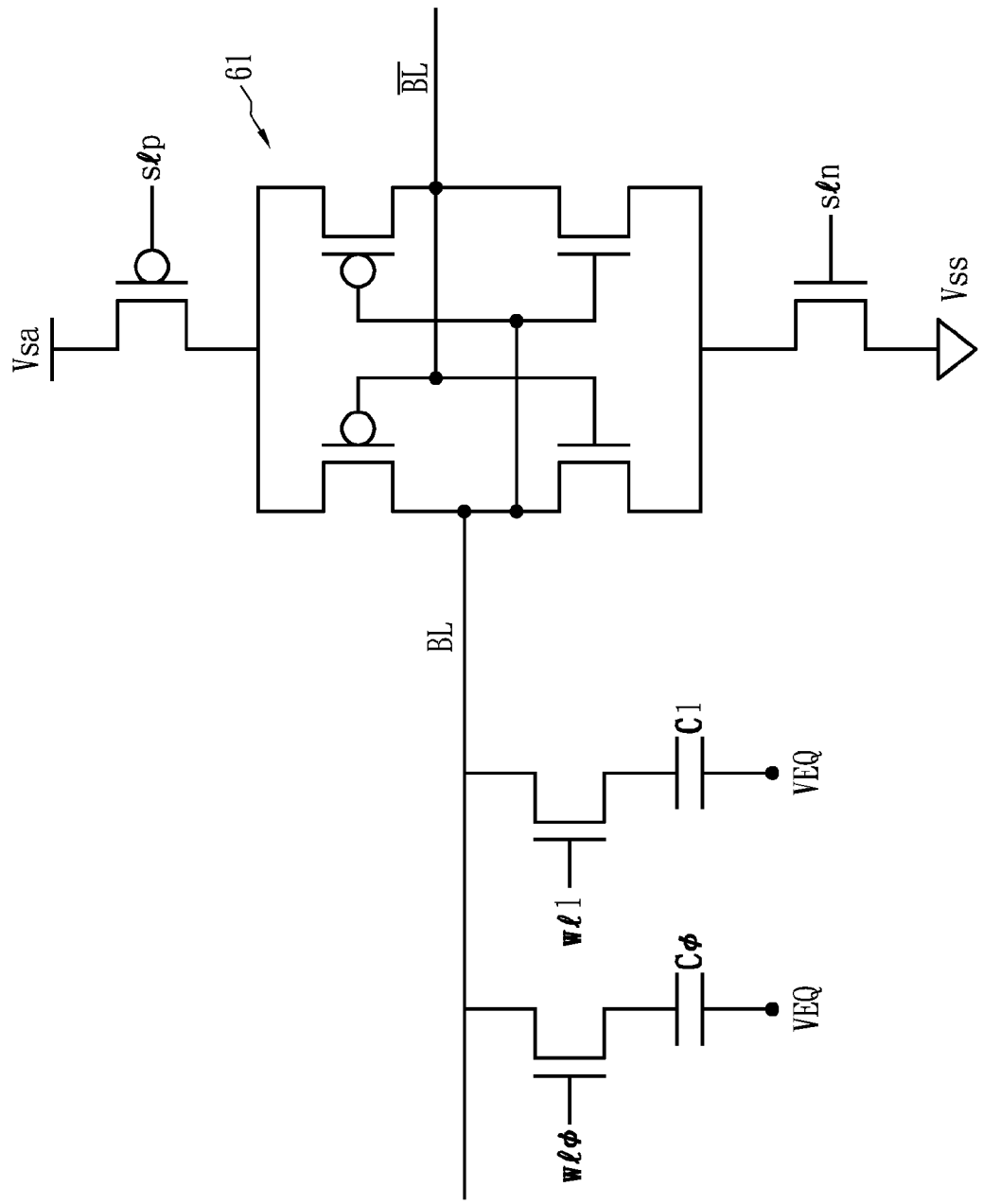
FIG. 6 shows a refresh operation as to a bit-line sense amplifier.

FIG. 6 shows a refresh operation as to a bit-line sense amplifier. In FIG. 6, VEQ is connected to a plate voltage of a DRAM array. When wl0 is turned on, the capacitor C0 shares the charge with the bit line. After a time delay, the signal "s1p" is pulled to low and signal "s1n" to low and therefore turns on the sense amplifier 61. Assuming C0 stores "1," therefore the voltage on bit line is greater than that on the other side. After sensing, the voltage on bit line is equal to $V_{SA}$, and that on the other side is equal to $V_{SS}$. That is, $V_{SA}$ will restore the charge to the capacitor C0. If a refresh request occurs as the signal OSC is in the low state, the refresh request latch is asserted as "ref. Request/8 μs" and "ref. Request/16 μs" shown in FIG. 3.

The capacitor 14 in both FIG. 1 and FIG. 2 is used to sustain the necessary voltage in standby mode such that the standby regulator can be periodically turned on. When the signal "opon," "opon1" or "opon2" is asserted, the capacitor 14 is charged to supply the lost charge. To achieve the purpose, the capacitance C needs to be calculated to overcome the leakage current and recover the internal power during the duration of "opon," "opon1" or "opon2" assertion.

The present invention can be applied to DRAM and SRAM or other memory devices.

The above-described embodiments of the present invention are intended to be illustrative only. Numerous alternative embodiments may be devised by those skilled in the art without departing from the scope of the following claims.

What is claimed is:

1. A voltage regulator circuit for a memory circuit, comprising:
    a voltage divider;
    a capacitor;
    an active-mode voltage regulator which is always on while in active mode, and turned on whenever a refresh is requested; and
    a standby-mode voltage regulator which is periodically turned on at regular and cyclical intervals while in standby mode, and turned on whenever a refresh is requested;
    wherein the active voltage regulator uses stronger transistors than those used by the standby-mode voltage regulator, and both the active-mode voltage regulator and the standby-mode voltage regulator are coupled to the voltage divider and to the capacitor.

2. The voltage regulator circuit of claim 1, wherein the active-mode voltage regulator comprises an operational amplifier, wherein the operational amplifier is controlled by turn-on conditions of the active-mode voltage regulator or standby mode voltage regulator.

3. The voltage regulator circuit of claim 1, wherein the standby-mode voltage regulator comprises an operational amplifier, wherein the operational amplifier is controlled by turn-on conditions of the standby-mode voltage regulator or standby mode voltage regulator.

4. The voltage regulator circuit of claim 1, wherein the capacitor has a capacitance which is sufficient to sustain the necessary voltage in while standby mode.

5. The voltage regulator circuit of claim 1, wherein the standby-mode voltage regulator is turned on periodically while in standby mode for at least a half-cycle duration of an oscillation signal per eight cycle times.

6. The voltage regulator circuit of claim 1, wherein the voltage divider is made of series-connected transistors with pre-determined equivalent resistors.

* * * * *